US010784827B2

(12) United States Patent
Mason

(10) Patent No.: US 10,784,827 B2
(45) Date of Patent: Sep. 22, 2020

(54) POWER MANAGEMENT SYSTEM FOR BATTERY-POWERED AUDIO DEVICE

(71) Applicant: THX LTD., San Fransisco, CA (US)

(72) Inventor: Andrew John Mason, Mono (CA)

(73) Assignee: THX LTD., San Fransisco, CA (US)

( * ) Notice: Subject to any disclaimer, the term of this patent is extended or adjusted under 35 U.S.C. 154(b) by 0 days.

(21) Appl. No.: 16/053,729

(22) Filed: Aug. 2, 2018

(65) Prior Publication Data

US 2019/0044486 A1 Feb. 7, 2019

Related U.S. Application Data

(60) Provisional application No. 62/542,179, filed on Aug. 7, 2017.

(51) Int. Cl.

| H03F 3/217 | (2006.01) |
| H03F 3/185 | (2006.01) |
| H02J 7/02  | (2016.01) |
| H02J 7/00  | (2006.01) |
| H02J 7/06  | (2006.01) |

(Continued)

(52) U.S. Cl.
CPC .......... *H03F 3/2173* (2013.01); *H02J 7/0068* (2013.01); *H02J 7/022* (2013.01); *H02J 7/045* (2013.01); *H02J 7/06* (2013.01); *H02J 7/34* (2013.01); *H03F 3/185* (2013.01); *H04R 3/00* (2013.01); *H02M 3/1582* (2013.01); *H03F 2200/03* (2013.01); *H03F 2200/144* (2013.01);
(Continued)

(58) Field of Classification Search
CPC .... H03F 2200/03; H03F 3/2173; H03F 3/185; H03F 2200/144; H04R 3/00; H04R 2420/07; H04R 2201/028; H04M 3/1582; H02J 7/022; H02J 7/045; H02J 7/06; H02J 7/34; H02J 7/0068
USPC ......................................................... 381/120
See application file for complete search history.

(56) References Cited

U.S. PATENT DOCUMENTS

| 5,442,317 A * | 8/1995 | Stengel ................. H02M 3/158 330/10 |
| 5,986,437 A * | 11/1999 | Lee ........................... G06F 1/26 320/162 |

(Continued)

OTHER PUBLICATIONS

International Search Report and the Written Opinion of the International Searching Authority for International application No. PCT/US2018/045060, dated Nov. 2, 2018, pp. 13.

*Primary Examiner* — Paul Kim
(74) *Attorney, Agent, or Firm* — Schwabe, Williamson & Wyatt, P.C.

(57) ABSTRACT

Embodiments provide a power management system for a battery-powered audio device. The system includes bi-directional power conversion and control circuitry to implement a corresponding control scheme. The system may be switchable between a charge mode, during which the power conversion and control circuitry charges the battery of the audio device and the AC/DC adapter provides an amplifier supply voltage to one or more amplifiers of the audio device, and a discharge mode, in which the power conversion and control circuitry may provide a regulated amplifier supply voltage to the one or more amplifiers that is regulated based on one or more operating conditions of the system. The system may provide reduced cost and reduced power consumption and reduced size compared with prior systems.

20 Claims, 14 Drawing Sheets

(51) Int. Cl.
*H04R 3/00* (2006.01)
*H02J 7/04* (2006.01)
*H02J 7/34* (2006.01)
*H02M 3/158* (2006.01)

(52) U.S. Cl.
CPC .... *H04R 2201/028* (2013.01); *H04R 2420/07* (2013.01)

(56) References Cited

U.S. PATENT DOCUMENTS

| | | | | |
|---|---|---|---|---|
| 2007/0190848 | A1* | 8/2007 | Zhang | H01R 13/6675 |
| | | | | 439/500 |
| 2015/0364997 | A1* | 12/2015 | Deng | H02M 3/1582 |
| | | | | 323/271 |

* cited by examiner

POWER MANAGEMENT SYSTEM FOR BATTERY-POWERED AUDIO DEVICE

CROSS REFERENCE TO RELATED APPLICATION

This application claims priority to U.S. Provisional Application No. 62/542,179, filed Aug. 7, 2017, the disclosure of which is herein incorporated by reference.

TECHNICAL FIELD

Embodiments herein relate to the field of electronic circuits, and, more specifically, to a power management system for battery-powered audio devices.

BACKGROUND

Portable wireless speakers typically include one or more amplifiers and a rechargeable battery. Current implementations include a power conversion circuits to power the one or more amplifiers from the battery, and a separate power conversion circuit to charge the battery. Each of the two power conversion circuits has its own associated control circuit, power transistors, and inductor. Additionally, the power conversion circuit to power the one or more amplifiers includes a boost converter that cannot output a lower voltage than its input voltage, thereby leading to significant power consumption.

BRIEF DESCRIPTION OF THE DRAWINGS

Embodiments will be readily understood by the following detailed description in conjunction with the accompanying drawings and the appended claims. Embodiments are illustrated by way of example and not by way of limitation in the figures of the accompanying drawings.

DETAILED DESCRIPTION OF DISCLOSED EMBODIMENTS

Figure 1:
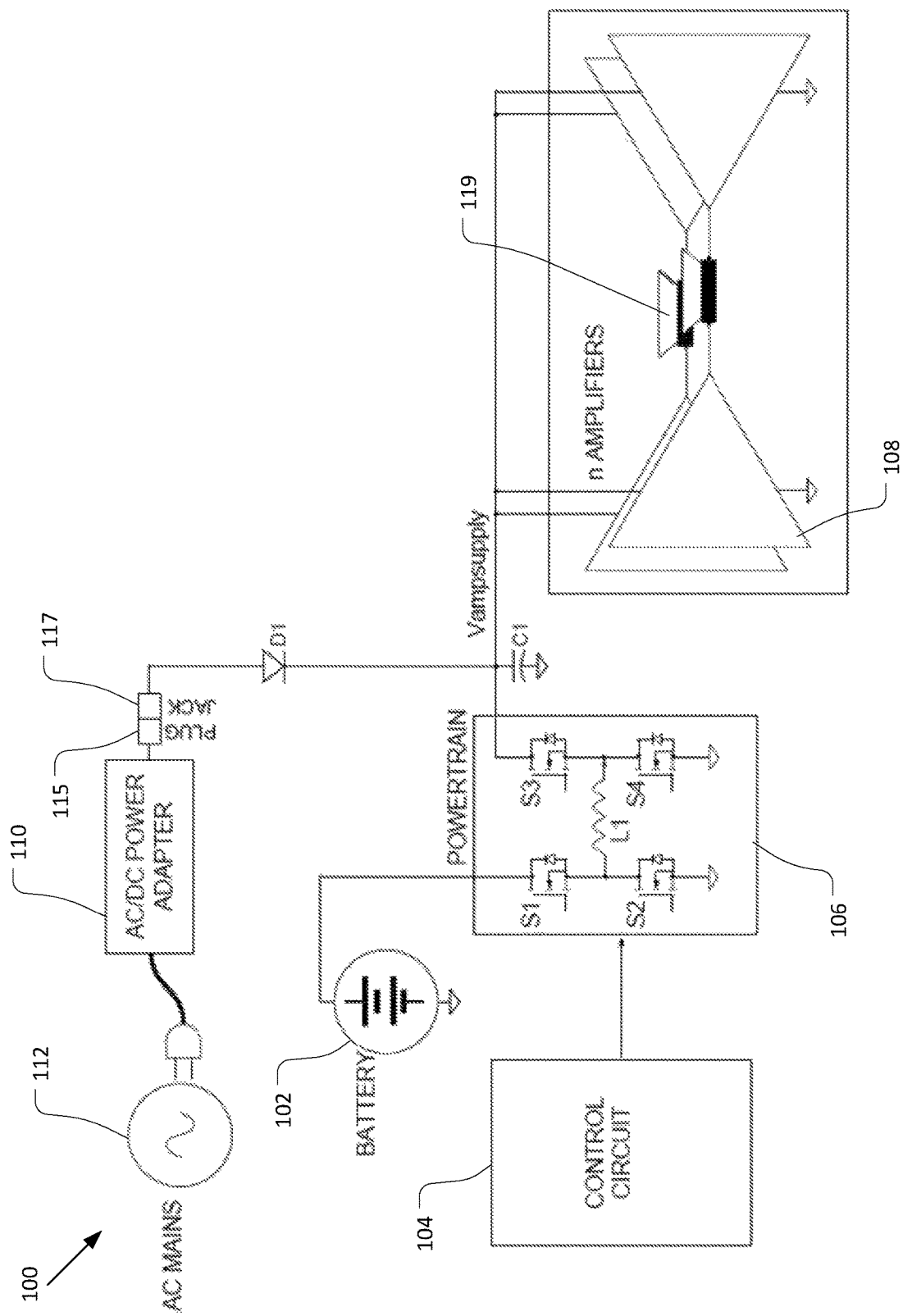
FIG. 1 schematically illustrates a battery-powered audio system in accordance with various embodiments.

In the following detailed description, reference is made to the accompanying drawings which form a part hereof, and in which are shown by way of illustration embodiments that may be practiced. It is to be understood that other embodiments may be utilized and structural or logical changes may be made without departing from the scope. Therefore, the following detailed description is not to be taken in a limiting sense.

Various operations may be described as multiple discrete operations in turn, in a manner that may be helpful in understanding embodiments; however, the order of description should not be construed to imply that these operations are order-dependent.

The description may use perspective-based descriptions such as up/down, back/front, and top/bottom. Such descriptions are merely used to facilitate the discussion and are not intended to restrict the application of disclosed embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" or in the form "A and/or B" means (A), (B), or (A and B). For the purposes of the description, a phrase in the form "at least one of A, B, and C" means (A), (B), (C), (A and B), (A and C), (B and C), or (A, B and C). For the purposes of the description, a phrase in the form "(A)B" means (B) or (AB) that is, A is an optional element.

The description may use the terms "embodiment" or "embodiments," which may each refer to one or more of the same or different embodiments. Furthermore, the terms "comprising," "including," "having," and the like, as used with respect to embodiments, are synonymous, and are generally intended as "open" terms (e.g., the term "including" should be interpreted as "including but not limited to," the term "having" should be interpreted as "having at least," the term "includes" should be interpreted as "includes but is not limited to," etc.).

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

With respect to the use of any plural and/or singular terms herein, those having skill in the art can translate from the plural to the singular and/or from the singular to the plural as is appropriate to the context and/or application. The various singular/plural permutations may be expressly set forth herein for sake of clarity.

Embodiments herein provide a power management system for a battery-powered audio device. The disclosed system may provide reduced cost and reduced power consumption compared with prior systems. When operated from a battery, the disclosed system can extend battery run time for a given battery capacity (and/or enable a reduced battery size to be used). The disclosed system includes bi-directional power conversion and control circuitry to implement a corresponding control scheme. The system may further include one or more amplifier channels, a rechargeable battery, and/or an alternating current/direct current (AC/DC) adapter. The one or more amplifier channels may be coupled to respective amplifiers to drive one or more speaker drivers. The system may be wholly or partially enclosed within a housing. For example, in some embodiments, the AC/DC adapter may be external to the housing (e.g., a "brick" adapter). Additionally, or alternatively, the system may be implemented in any suitable device, such as a portable, battery-powered wireless audio device.

In various embodiments, the bi-directional power conversion and control circuitry may be switchable between a charge mode (e.g., when the AC/DC adapter is coupled between the one or more amplifiers and an external power source, such as AC mains (e.g., a wall socket)) and a discharge mode (e.g., when the AC/DC adapter is not coupled to the one or more amplifiers and/or to an external power source). During the charge mode, the bi-directional power conversion and control circuitry may charge the battery while the AC/DC adapter provides an amplifier supply voltage to the one or more amplifiers to maintain proper amplifier function (e.g., to drive the associated speaker drivers based on an input audio signal). In some embodiments, the bi-directional power conversion and control circuitry may adjust an amount of current that is used from the AC/DC adapter to charge the battery based on the amount of current from the AC/DC adapter that is used to provide power to the one or more amplifiers. Accordingly, the bi-directional power conversion and control circuitry may charge the battery as quickly as possible without exceeding the current rating of the AC/DC adapter (e.g., with a safety margin in some embodiments).

During the discharge mode, the bi-directional power conversion and control circuitry may generate an amplifier supply voltage from the battery and provide the amplifier supply voltage to the one or more amplifiers. In some embodiments, the amplifier supply voltage may be regulated to a variable voltage level. For example, the value of the amplifier supply voltage may be set by the bi-directional power conversion and control circuitry based on one or more operating conditions of the system (e.g., based on the audio input signal and/or the volume setting of the system). The regulated amplifier supply voltage may enable the amplifier supply voltage to be reduced when possible based on the one or more operating conditions while maintaining proper amplifier function, thereby providing increased battery run time and/or reduced battery size and cost.

FIG. 1 schematically illustrates a battery powered audio amplifier system 100 (hereinafter "system 100") in accordance with various embodiments. The system may include a rechargeable battery 102, a control circuit 104, a switching power conversion circuit 106 (also referred to as powertrain 106), one or more amplifiers 108, and an AC/DC adapter 110, coupled to one another as shown. For example, the power conversion circuit 106 may be coupled between the battery 102 and the one or more amplifiers 108 and between the battery 102 and the AC/DC adapter 110. The control circuit 104 may be coupled to the power conversion circuit 106. The AC/DC adapter 110 may be coupled with the power conversion circuit 106 and the one or more amplifiers 108 (e.g., via a diode D1).

In various embodiments, the AC/DC adapter 110 may be selectively coupled to an external power supply 112 (e.g., AC mains, such as a wall socket), and may convert the AC voltage from the external power supply to a DC input supply voltage. The DC input supply voltage may have any suitable value, such as, without limitation, 15 Volts (V) in one example. During the charge mode, the AC/DC adapter 110 may provide the DC input supply voltage to the power conversion circuit 106 and to the one or more amplifiers 108 (e.g., as the amplifier supply voltage). The one or more amplifiers 108 may operate (e.g., drive one or more speaker drivers coupled to the respective amplifiers 108) using the DC input supply voltage. Additionally, the power conversion circuit 106 may use the DC input supply voltage to charge the battery 102 (e.g., in cooperation with the control circuit 104).

In some embodiments, the AC/DC adapter 110 may be removably coupled to the one or more amplifiers 108 and power conversion circuit 106, for example via a plug 115 and jack 117. Such an AC/DC adapter may be referred to as a "brick" AC/DC adapter, and may be external to a housing that encompasses the battery 102, control circuit 104, power conversion circuit 106, and one or more amplifiers 108. In other embodiments, the AC/DC adapter 110 may be permanently coupled to the one or more amplifiers 108 and the power conversion circuit 106. In some such embodiments, the AC/DC adapter 110 may be enclosed within the housing of the battery-powered audio device.

In some embodiments, the control circuit 104 may control the power conversion circuit 106 to reduce or increase the amount (e.g., rate) of current consumed from the AC/DC adapter for charging the battery 102. For example, the amount of current consumed from the AC/DC adapter 110 by the sum total of the power conversion circuit 106 and the amplifiers 108 may be monitored, and the control circuit 104 may adjust (e.g., using a feedback or feed-forward loop) the switch timing of the power conversion circuit 106 to maintain regulation of this AC/DC adapter current in order to maximize the rate of battery charging while not exceeding the current rating of the AC/DC power adapter (in some cases, with a safety margin). In some embodiments, the control circuit 104 may adjust the amount of current drawn by the power conversion circuit 106 to charge the battery 102 based on the amount of current that is drawn by the one or more amplifiers 108. The current drawn by the one or more amplifiers 108 may be determined directly or estimated based on one or more operating conditions of the system 100, such as one or more parameters of the audio signal (e.g., a moving average of the rms (e.g., for Class D amplifiers) or average (e.g., for Class A, AB, or B amplifiers) voltage of the input audio signals provided to the amplifiers 108 or the output audio signal generated by the amplifiers 108), and/or one or more other suitable operating parameters.

During the discharge mode of the system 100, the AC/DC adapter 110 may not be coupled to the external power supply and/or to the power conversion circuit 106 and one or more amplifiers 108 (e.g., when the AC/DC adapter is an external "brick" adapter that is disconnected from the housing of the audio device). Accordingly, the power conversion circuit may generate an amplifier supply voltage (Vampsupply) from the voltage provided by the battery 102 and provide the amplifier supply voltage to the one or more amplifiers 108. The one or more amplifiers 108 may operate using the amplifier supply voltage. The battery 102 may provide any suitable battery voltage, such as, without limitation, 7.2V in one example.

In various embodiments, the amplifier supply voltage provided by the power conversion circuit 106 may be regulated based on one or more operating conditions, such as the system volume setting and/or one or more parameters of the audio signal (e.g., the magnitude of the audio signal at the input or output of the amplifiers 108, a time-advance envelope of the upcoming audio signal, and/or one or more other suitable parameters). For example, the power conversion circuit 106 may provide the regulated amplifier supply voltage with a voltage level that is less than the battery supply voltage when permitted based on the one or more operating conditions (e.g., for a relatively low volume level or audio signal level), thereby consuming less power than if the amplifier supply voltage were kept at a constant value (e.g., at the battery supply voltage). In some embodiments, the regulated amplifier supply voltage may not be lowered to less than a minimum voltage, which may correspond to a minimum voltage required for proper function of the amplifiers 108 (e.g., even at low volume level or audio signal level).

Additionally, or alternatively, in some embodiments, the power conversion circuit 106 may provide the regulated amplifier supply voltage with a voltage value that is greater than the battery supply voltage when dictated by the one or more operating conditions (e.g., at a relatively high volume level or audio signal level), thereby enabling the amplifiers 108 to achieve higher peak output power than if the amplifier supply voltage were limited to the battery supply voltage. Accordingly, in some embodiments, the power conversion circuit 106 may be capable of providing the regulated amplifier supply voltage with a voltage level that is less than, equal to, or greater than the battery supply voltage depending on the one or more operating conditions.

As shown in FIG. 1, one implementation of the power conversion circuit 106 may include transistors (e.g., metal-oxide-semiconductor field-effect transistors (MOSFETs) S1-S4, and an inductor L1. Although the power conversion circuit 106 is described herein with reference to MOSFETs, other embodiments may include another suitable type of transistors. In some embodiments, the battery 102 may be coupled to a drain terminal of the MOSFET S1, and the power rail of the amplifiers 108 may be coupled to a drain terminal of the MOSFET S3 to receive the amplifier supply voltage Vampsupply during the discharge mode. The drain terminal of the MOSFET S2 may be coupled with the source terminal of the MOSFET S1, and the drain terminal of the MOSFET S4 may be coupled with the source terminal of the MOSFET S3. The inductor L1 may be coupled between a first node that is between the MOSFETS S1 and S2 and a second node that is between the MOSFETS S3 and S4. The control circuit 104 may provide respective drive signals to the gate terminals of the MOSFETS S1-S4 to control operation of the power conversion circuit 106. The operation of the power conversion circuit 106 will be further described below with respect to FIG. 2.

In some embodiments, MOSFET S2 in the power conversion circuit 106 may be replaced with a diode.

In various embodiments, the system 100 may provide a single control circuit 104 and a single power conversion circuit 106, in contrast with prior systems that employed separate control circuits and power conversion circuits for charging and for driving the amplifiers, respectively. Accordingly, the system 100 may include one fewer control circuit and one fewer inductor than prior designs, thereby reducing the cost, size, and implementation complexity of the system 100 compared with prior systems. In some embodiments, the control circuit 104 and the power conversion circuit 106 less the inductor may be disposed on a single integrated circuit (IC). In other embodiments, the control circuit 104 and the power conversion circuit 106 less the inductor may be disposed on two different ICs. In other embodiments, aspects of the control circuit 104 may be disposed on different ICs that are coupled with one another.

Furthermore, the variable regulated amplifier supply voltage provided by the power control circuit 104 and power conversion circuit 106 may reduce power consumption of the system 100, thereby prolonging the battery run time of the battery 102 and/or allowing for a smaller capacity battery 102 to be used in the system 100. Additionally, the peak current demands from the AC/DC adapter 110 may be reduced compared with prior systems, thereby permitting a reduction in the size and cost of the AC/DC adapter. Moreover, the regulated amplifier supply voltage may enable higher peak output power for the one or more amplifiers 108 when needed, while also providing power savings when possible.

In various embodiments, the one or more amplifiers 108 may have any suitable amplifier topology, such as a linear type amplifier (e.g., Class A, Class AB, Class B), a switching type amplifier (e.g. Class D), another suitable type of amplifier, and/or a combination of amplifier types. In embodiments that include multiple amplifiers 108, the amplifiers 108 may be bridged, as shown in FIG. 1. The amplifiers 108 may operate from the same, unipolar supply bus to receive the amplifier supply voltage. The amplifiers 108 may be coupled to respective speaker drivers 119 to drive the speaker drivers 119 based on the input audio signals received by the respective amplifiers 108.

Figure 2:
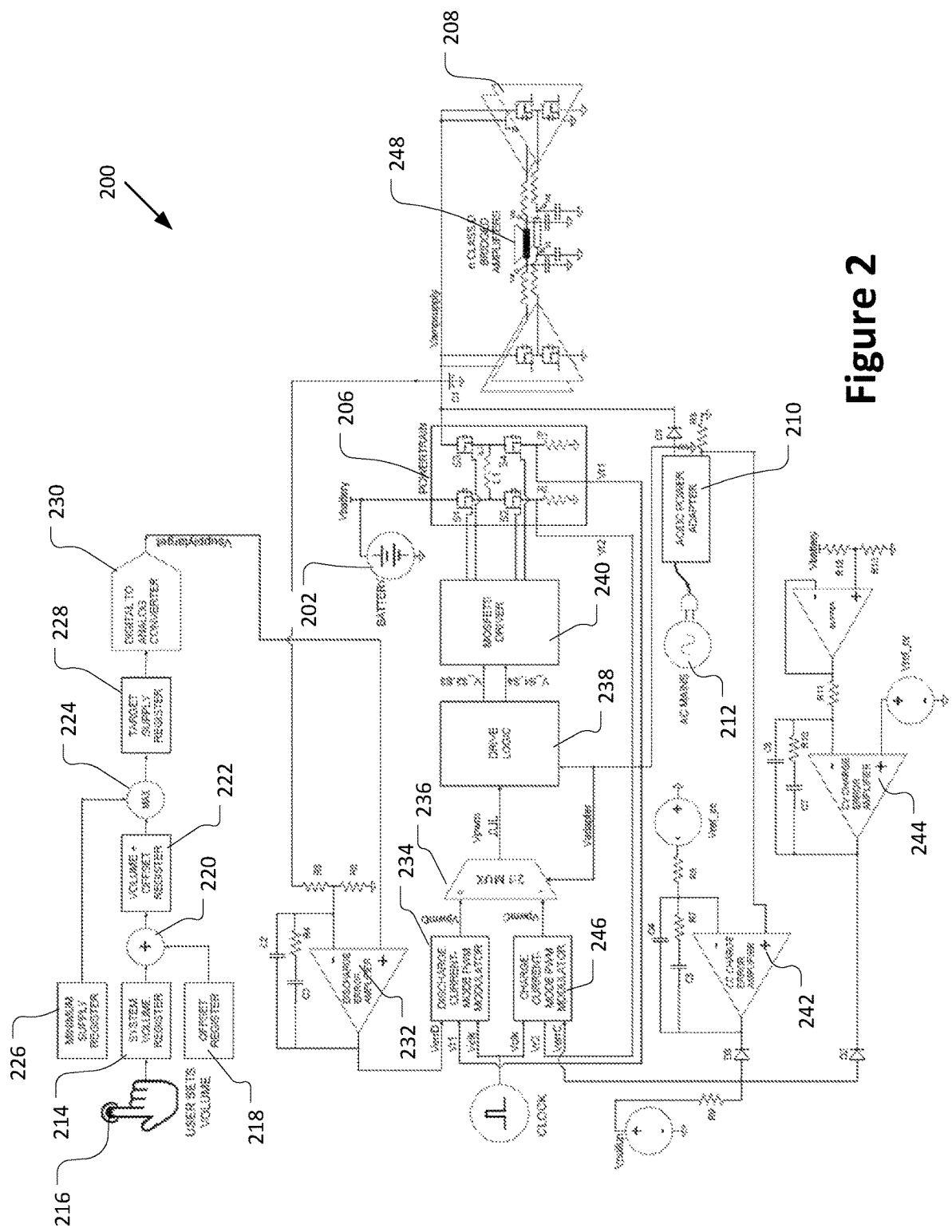
FIG. 2 schematically illustrates a battery-powered audio system to provide a regulated amplifier supply voltage based on a volume setting of the system during a discharge mode of the system, in accordance with various embodiments.

FIG. 2 illustrates a portable battery-powered audio system 200 (hereinafter "system 200") in accordance with various embodiments. System 200 may be an example implementation of the system 100 described above with reference to FIG. 1. For example, the system 200 may include a battery 202 that corresponds to the battery 102, a power conversion circuit (powertrain) 206 that corresponds to the power conversion circuit 106, amplifiers 208 that correspond to the amplifiers 108, and AC/DC converter 210 that corresponds to the AC/DC converter 110. Some or all remaining circuit blocks shown in FIG. 2 may be included in a control circuit that may correspond to the control circuit 104 of system 100.

In various embodiments, the AC/DC converter may be selectively coupled to an AC supply voltage 212 (e.g., a wall socket). As previously discussed with respect to system 100, the system 200 may be switchable between a discharge mode, in which the amplifier supply voltage Vampsupply is provided by the power conversion circuit 206 from the battery 202, and a charge mode, in which the amplifier supply voltage Vampsupply is provided by the AC/DC power adapter 210 and the power conversion circuit 206 charges the battery 202. The system 200 may determine whether the system 200 is in the discharge mode or the charge mode based on voltage Vadapter. The voltage Vadapter may be provided by the AC/DC adapter, and may correspond to the amplifier supply voltage Vampsupply provided by the AC/DC adapter 210 while the AC/DC adapter is coupled to the AC supply voltage 212 and the amplifiers 208, thereby indicating that the external power source (the AC supply voltage 212) is connected to the system 200.

In various embodiments, the system 200 shown in FIG. 2 may adjust the amplifier supply voltage (Vampsupply) provided to the amplifiers 208 during the discharge mode based on the volume level setting of the system 200 (e.g., as set by the user). For example, in some embodiments, the system 200 may regulate the amplifier supply voltage to be proportional to the volume level setting plus an offset, and subject to a minimum value.

As shown in FIG. 2, a system volume register 214 may store the volume level setting. The volume level setting may be set by a user of the system 200 using a volume interface 216. The volume interface 216 may include, for example, one or more buttons, a wireless interface (e.g., to interact with an electronic device such as a smartphone, an application on an electronic device, and/or a dedicated remote control), a touchscreen, a microphone (e.g., to receive voice commands from the user), and/or another suitable interface. In some embodiments, the system volume register 214 may be included in the battery-powered audio device that implements the system 200. In other embodiments, the system volume register 214 may be included in an external device (e.g., smartphone), and the system 200 may receive the volume level setting that is stored in the system volume register 214 from the external device.

An offset value (e.g., stored in an offset register 218) may be added to the volume level setting at block 220, and the resulting value may be stored in a register 222. Block 224 determines the larger value between the value stored in the register 222 (corresponding to the volume level plus the offset value) and a minimum supply voltage value (e.g., stored in a register 226), and passes the larger value to a target supply register 228. A digital-to-analog (DAC) converter 230 may convert the target value stored in the target supply register 228 to an analog target supply voltage (Vsupplytarget). The registers 214, 218, 222, 226, and 228 may be continually updated (e.g., responsive to a clock signal and/or responsive to a change in the volume level setting stored by the system volume register 214) to provide an updated value for the target supply voltage.

In the embodiment shown in FIG. 2, the registers 214, 218, 222, 226, and 228 may be digital registers, and the corresponding values stored in the respective registers may be digital values. However, it will be apparent that in other embodiments, one or more of the registers may be an analog register. Additionally, or alternatively, aspects of the system 200, such as one of more of the registers, may be implemented in software and/or firmware.

In various embodiments, the target supply voltage Vsupplytarget corresponds to the intended supply voltage to be applied to the amplifiers by the system 200 during the discharge mode, as further discussed below. For example, the amplifier supply voltage Vampsupply that is provided to the amplifiers 208 during the discharge mode may be substantially proportional to the target supply voltage Vsupplytarget.

In various embodiments, the target supply voltage Vsupplytarget may be provided to a first input terminal of discharge error amplifier 232. A second input terminal of the discharge error amplifier 232 may receive a version of the amplifier supply voltage Vampsupply (e.g., a scaled-down version of the amplifier supply voltage Vampsupply as provided by resistors R5 and R6). The discharge error amplifier 232 may generate an error voltage VerrD that indicates (e.g., is proportional to) a difference between the version of the amplifier supply voltage Vampsupply and the target supply voltage Vsupplytarget. Accordingly, the error voltage VerrD may indicate how the amplifier supply voltage needs to be adjusted to arrive at its target value.

In various embodiments, the discharge error amplifier 232 may provide the error voltage VerrD to a discharge current-mode pulse-width modulation (PWM) modulator 234. The discharge current-mode PWM modulator 234 may further receive a voltage signal Vr1 that indicates a peak current through the inductor L1 of the power conversion circuit 206. The discharge current-mode PWM modulator 234 may generate a discharge-mode variable pulse-width modulated (PWM) signal VpwmD based on the error voltage VerrD and the peak current through the inductor L1 as indicated by the voltage signal Vr1. The signal VpwmD may be used to control the power conversion circuit 206 (e.g., to control the switching time of the MOSFETs S1-S4 and the peak current in inductor L1) to generate the amplifier supply voltage Vampsupply with the target voltage level during the discharge mode.

In various embodiments, a resistor R1 may be coupled between the source terminal of MOSFET S4 and ground to provide the voltage signal Vr1 (e.g., from the node between the resistor R1 and the MOSFET S4) to implement a peak-current-mode control PWM scheme during discharge mode. During the discharge mode, resistor R2, which may be coupled between the source terminal of MOSFET S2 and ground, may be used to sense the current going to the amplifiers 108 (e.g., via the amplifier supply voltage Vampsupply) in order to control a synchronous-rectifier scheme for MOSFETs S2 and S3.

In various embodiments, the discharge-mode variable PWM signal VpwmD may be passed to an input terminal of a multiplexer 236. The multiplexer 236 may also receive a charge-mode variable PWM signal VpwmC (further discussed below) at another input terminal and may further receive the signal Vadapter at a selection terminal. When the signal Vadapter indicates that the system 200 is in the discharge mode (e.g., when the AC/DC adapter is not providing power and Vadapter is consequently logic low), the multiplexer may pass the discharge-mode variable PWM signal to its output terminal (e.g., as Vpwm) to control the power conversion circuit 206 (e.g., via drive logic 238 and/or a MOSFETs driver 240).

In contrast, if the signal Vadapter indicates that the system 200 is in the charge mode (e.g., when Vadapter is logic high), then the multiplexer 236 will pass the charge-mode variable PWM signal VpwmC to its output terminal (e.g., as Vpwm). In various embodiments, charge-mode circuitry of the system 200 may include a constant current (CC) charge error amplifier 242, a constant voltage (CV) charge error amplifier 244, and a charge current-mode PWM modulator 246. The battery voltage Vbattery may be sensed by resistors R12 and R13 and passed to an input terminal of the CV charge error amplifier 244. The CV charge error amplifier 244 may receive a CV reference voltage Vref_cv at another input terminal and generate a CV error signal based on the comparison. The CV error signal from the CV charge error amplifier 244 may be provided to the charge current-mode PWM modulator 246 to regulate the battery voltage Vbattery to be no more than a target voltage that is proportional to Vref_cv.

The CC charge error amplifier 242 may compare the output current magnitude of the AC/DC adapter 210 (e.g., provided as a voltage by resistor R3 using ground-side sensing) with a target current magnitude (e.g., that is proportional to reference voltage Vref_cc). The target current may correspond to a rated output current of the AC/DC adapter 210 (with or without a safety margin subtracted) and the CC charge error amplifier 242 may output an error signal based on the comparison. The reference voltage Vref_cc may correspond to a voltage resulting from passing the target current through the resistor R3. The error signal from the CC charge error amplifier 242 may be provided to the charge current-mode PWM modulator 246 to regulate the output current of the AC/DC adapter 210 to no more than the target current. In some embodiments, the one of the error signal from the CC charge error amplifier 242 or the error signal from the CV charge error amplifier 244 having the lesser value may be provided to the charge current-mode PWM modulator 246 as a charge error signal VerrC. For example, the output terminals of the CC charge error amplifier 242 and the CV charge error amplifier 244 may be coupled to the VerrC input terminal of the charge current-mode PWM modulator 246 via respective diodes D2 and D3. In the charge mode, the circuitry of system 200 may enable the AC/DC adapter 210 to supply power to the amplifiers (e.g., the amplifier supply voltage Vampsupply provided via diode D1) while also charging the battery as quickly as possible without exceeding the AC/DC adapter current rating.

For example, when the battery voltage is low, the CV charge error amplifier 244 may saturate to a high output voltage. The CC charge error amplifier 242 may provide its error signal to the charge current-mode PWM modulator 246, permitting the battery 202 to charge as fast as the current limit of the AC/DC adapter 210 will permit. As the battery voltage rises to its maximum, the CV charge error amplifier 244 will begin to provide its error signal to the charge current-mode PWM modulator 246 instead of the error signal from the CC charge error amplifier 242, to gradually reduce the PWM index provided by the charge current-mode PWM modulator 246 to taper down the charging current while maintaining the battery voltage at the target maximum.

In various embodiments, the charge current-mode PWM modulator may generate the charge-mode PWM signal VpwmC based on the charge error signal VerrC and a signal Vr2 that indicates the peak current through inductor L1 of the power conversion circuit 206. The signal Vr2 may be provided by resistor R2. Resistor R1 of the power conversion circuit 206 may be used to sense the current going from the power conversion circuit 206 to the battery 202 in order to control a synchronous-rectifier scheme for MOSFETs S1 and S4.

In some embodiments, one or more additional or alternative limits on the battery-charging current may be imposed in the charge current-mode PWM modulator 246. For example, in some cases, the maximum battery charge current may be limited to less than the current rating of the AC/DC adapter 210 in order to not exceed the charge-current rating of the battery 202.

Additionally, or alternatively, in some embodiments, during the discharge mode and when the target supply voltage is lower than the battery voltage Vbattery, the MOSFET S3 of the power conversion circuit 206 may remain ON (e.g., for a complete clock cycle) and the MOSFET S4 may remain OFF. The MOSFET S1 ON time pulse width may be modulated (e.g., by the discharge current-mode PWM modulator) and the MOSFET S2 may be used as a synchronous rectifier. Accordingly, the power conversion circuit 206 may behave as a buck converter.

Additionally, or alternatively, in some embodiments, during the discharge mode and when the target supply voltage is higher than the battery voltage Vbattery, the MOSFET S1 may remain ON and the MOSFET S2 may remain OFF. The MOSFET S4 ON time pulse width may be modulated (e.g., by the discharge current-mode PWM modulator) and the MOSFET S3 may be used as a synchronous rectifier. Accordingly, the power conversion circuit 206 may behave as a boost converter.

In other embodiments, the MOSFETs S1-S4 of the power conversion circuit 206 may be activated (e.g., by the drive logic 238) in another suitable fashion familiar to those skilled in the art of power conversion in order to achieve a regulated amplifier supply voltage Vampsupply that is higher, lower, or equal to the battery voltage Vbattery.

In various embodiments, the amplifiers 208 are powered using the amplifier supply voltage Vampsupply to generate respective amplifier output signals Va, Vb, Vc, and Vd, based on respective amplifier input signals (e.g., received from an audio processor). The amplifier output signals are passed to respective speaker drivers 248 to drive the speaker drivers.

Figure 3:
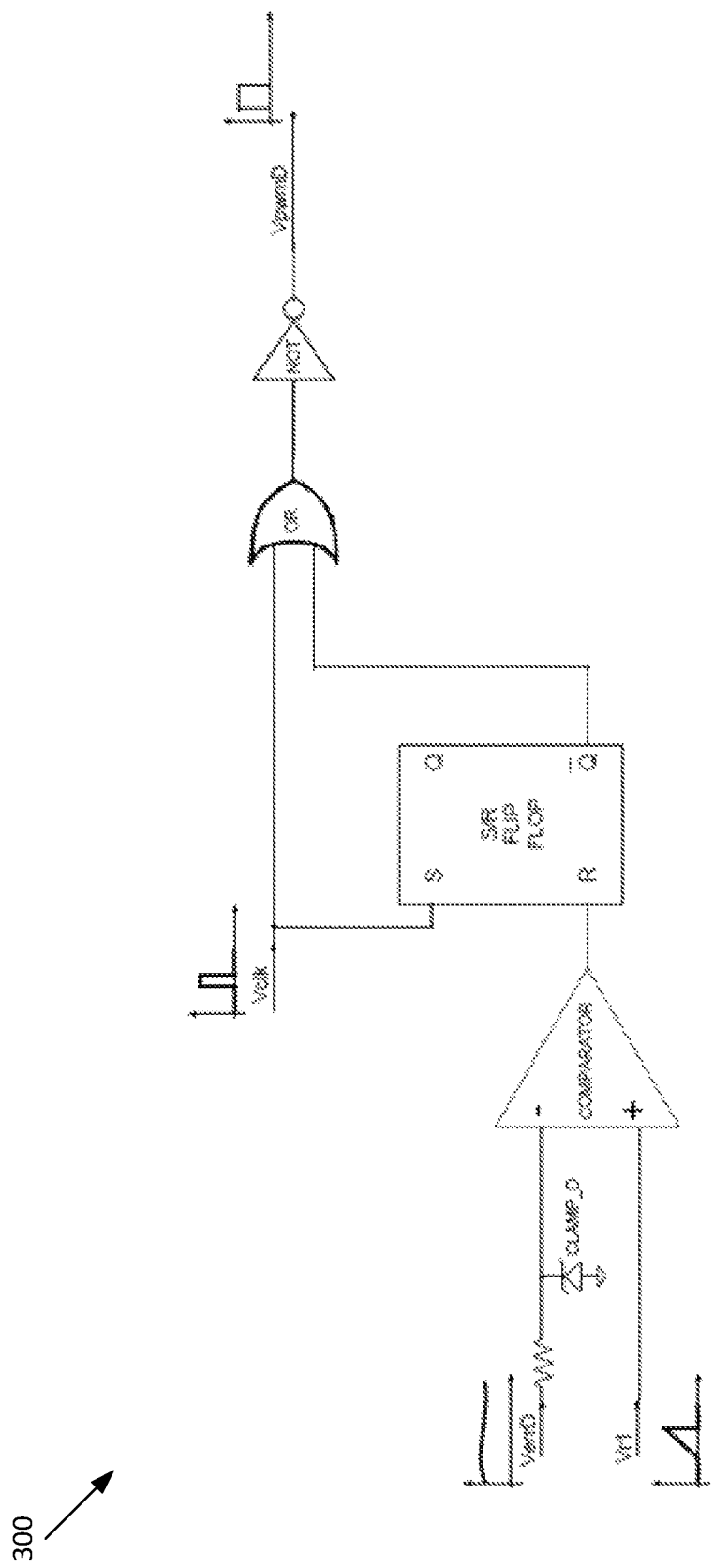
FIG. 3 illustrates an example discharge current-mode pulse width modulation (PWM) modulator circuit that may be employed by the system of FIG. 2, in accordance with various embodiments.

FIG. 3 illustrates a discharge current-mode PWM modulator circuit 300 that may be used in some embodiments of the discharge current-mode PWM modulator 234. As discussed above with respect to the discharge current-mode PWM modulator 234, the discharge current-mode PWM modulator circuit 300 may generate a discharge-mode variable PWM signal VpwmD based on the error voltage VerrD and the peak current through the inductor L1 as indicated by the voltage signal Vr1. Other modulation schemes may be used in other embodiments, such as a voltage-mode PWM scheme, variable-frequency constant-on-time pulse-density modulation, and/or another modulation scheme known to those skilled in the art of power conversion.

Figure 4:
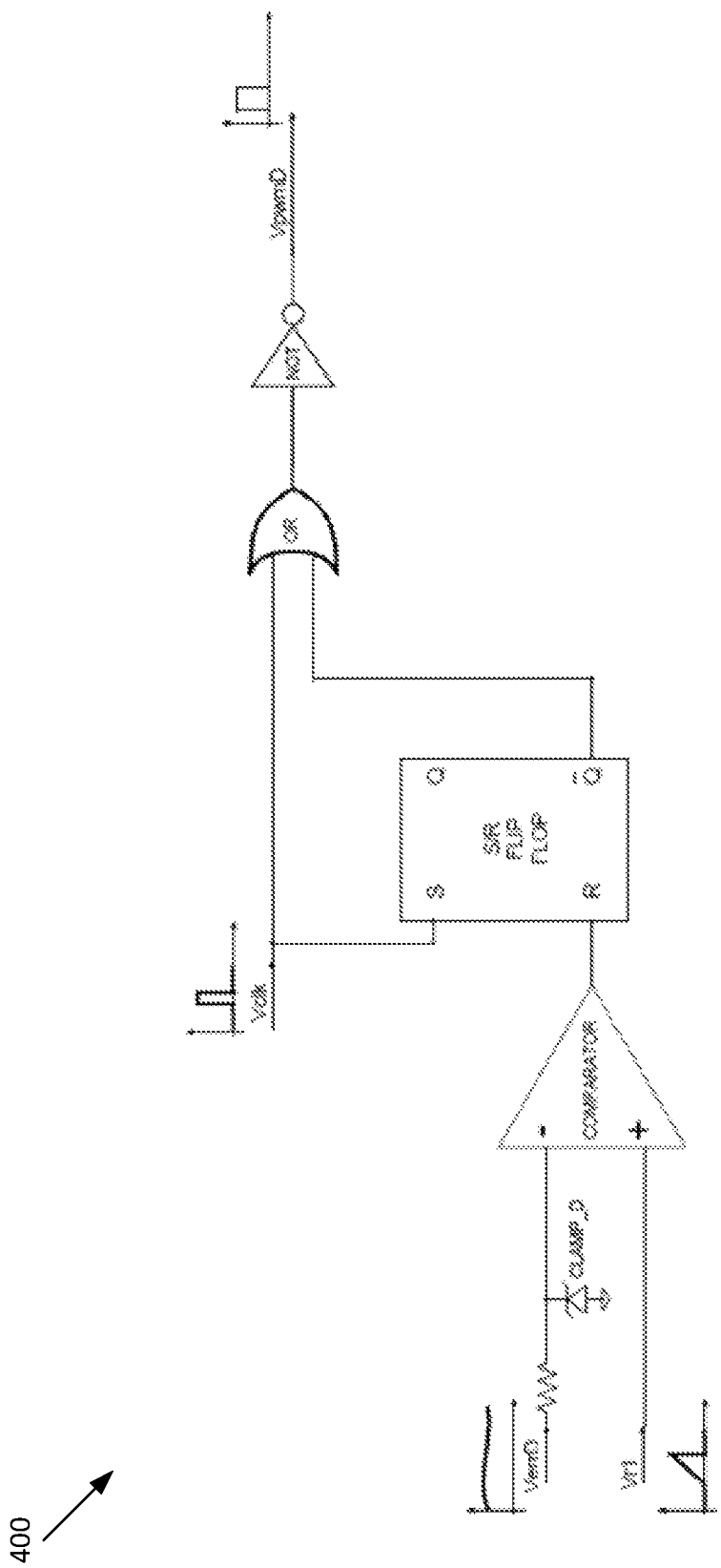
FIG. 4 illustrates an example charge current-mode PWM modulator circuit that may be employed by the system of FIG. 2, in accordance with various embodiments.

FIG. 4 illustrates a charge current-mode PWM modulator circuit 400 that may be used in some embodiments of the charge current-mode PWM modulator 246. As discussed above with respect to the charge current-mode PWM modulator 246, the charge current-mode PWM modulator circuit 400 may generate the charge-mode PWM signal VpwmC based on the charge error signal VerrC and the peak current through inductor L1 of the power conversion circuit as indicated by the signal Vr2. Similar to the discharge current-mode PWM modulator circuit 300, other modulation schemes may be used in other embodiments, such as a voltage-mode PWM scheme, variable-frequency constant-on-time pulse-density modulation, and/or another modulation scheme known to those skilled in the art of power conversion.

Figure 5:
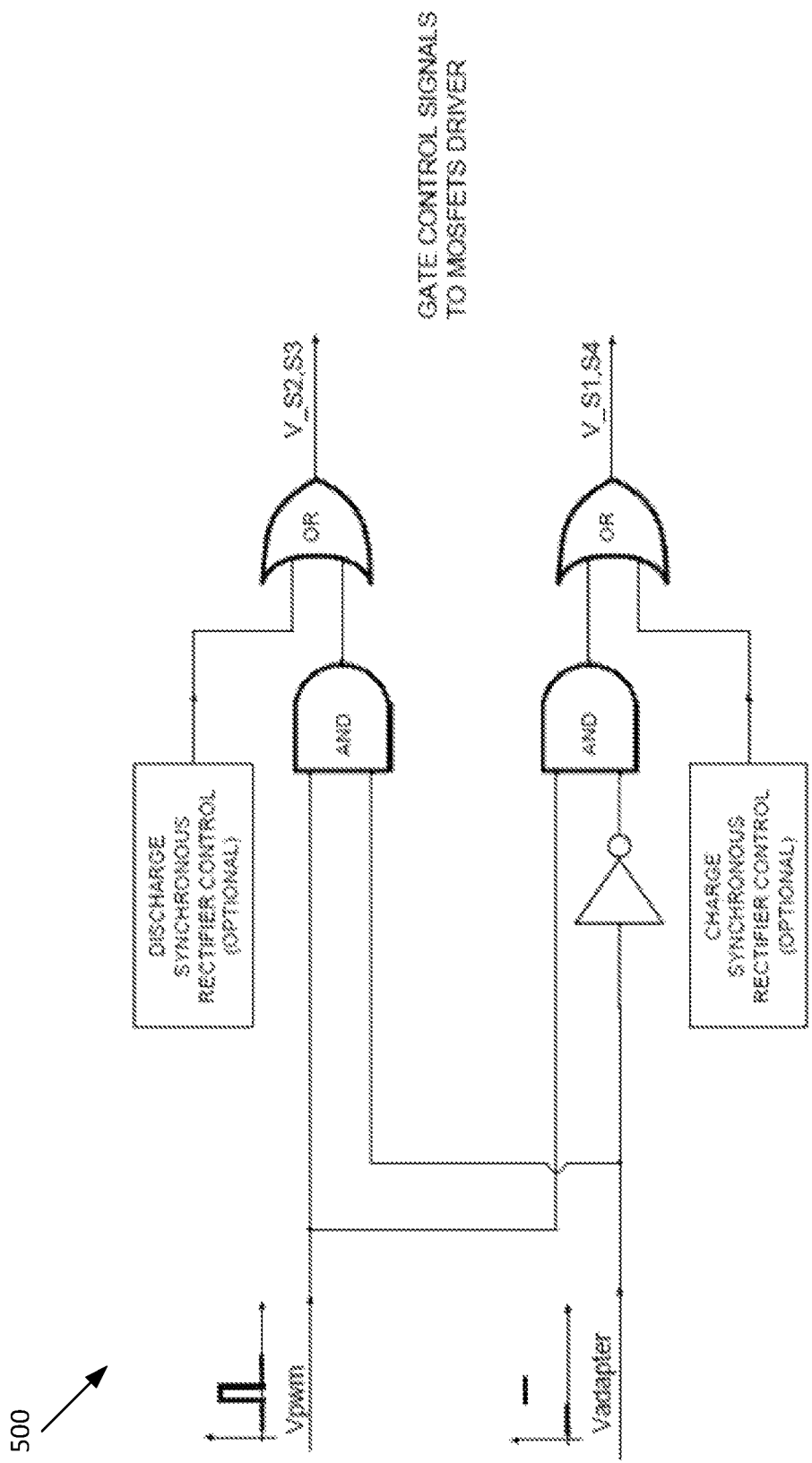
FIG. 5 illustrates an example drive logic circuit that may be employed by the system of FIG. 2, in accordance with various embodiments.

FIG. 5 illustrates a drive logic circuit 500 that may be used for the drive logic 238 of system 200 in some embodiments. The drive logic circuit 500 may provide drive signals for the MOSFETS S1-S4 of the power conversion circuit (e.g., power conversion circuit 206) based on the PWM signal Vpwm and the Vadapter signal that indicates whether the system is in the charge mode or the discharge mode. The drive logic circuit 500 may provide a first drive signal (V_S1,S4) to the MOSFETs S1 and S4 of the power conversion circuit 206, e.g., to turn the MOSFETs S1 and S4 ON or OFF simultaneously. Additionally, the drive logic circuit 500 may provide a second drive signal (V_S2,S3) to the MOSFETs S2 and S3, e.g., to turn the MOSFETs S2 and S3 ON or OFF simultaneously. The Vadapter signal determines which pair of MOSFETs is turned ON according to the Vpwm signal. Synchronous rectification signals may be generated by the drive logic circuit 500 to turn ON the opposing pair of MOSFETs when the Vpwm signal goes low, then turn them OFF when either the inductor current falls to zero or the Vpwm signal goes high again.

Figure 6:
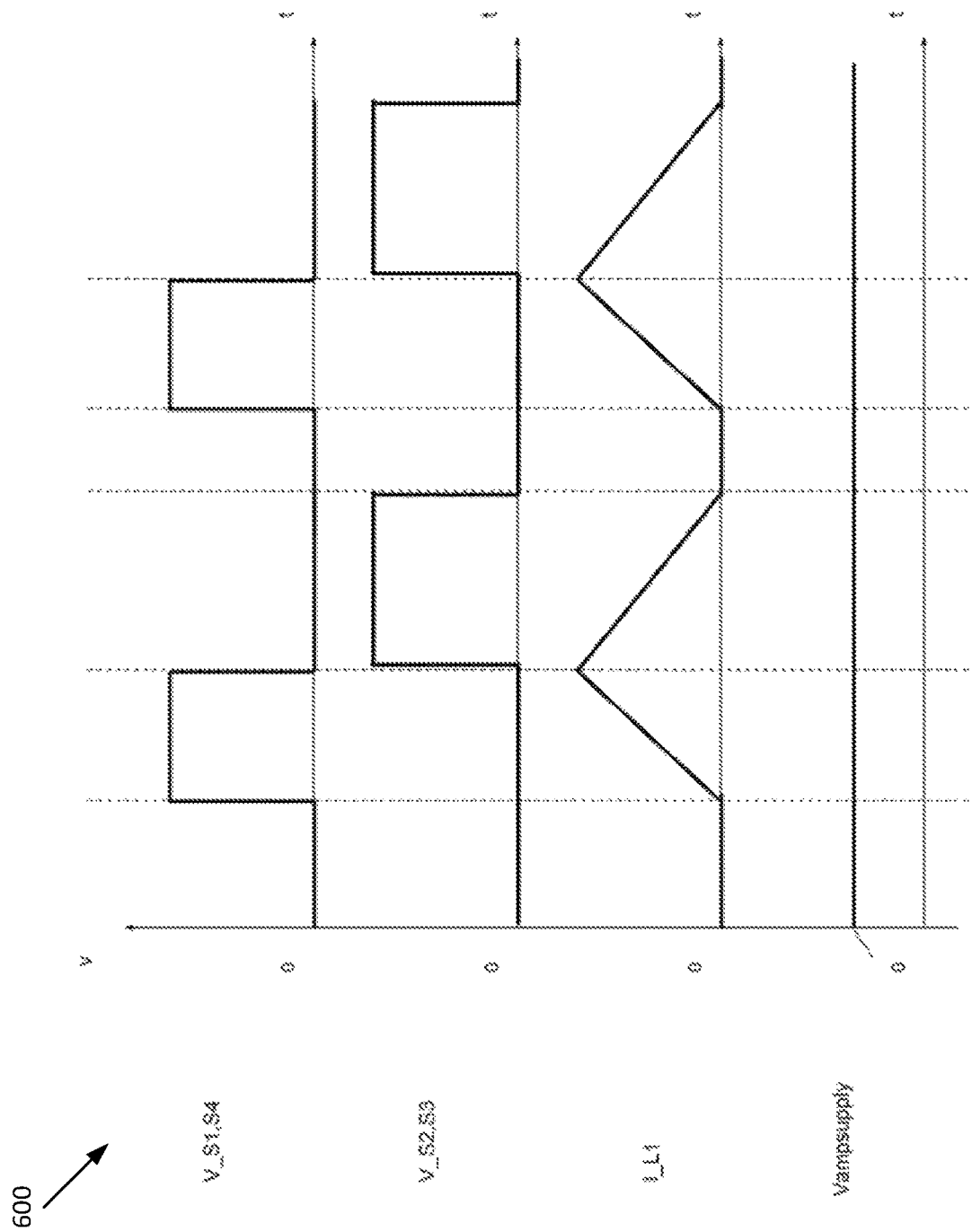
FIG. 6 illustrates example waveforms of various signals that may be used by the system of FIG. 2 in the discharge mode, in accordance with various embodiments.

FIG. 6 illustrates example waveforms 600 for various signals of the system 200 of FIG. 2 during the discharge mode, in accordance with various embodiments. The waveforms 600 include the first drive signal V_S1,S4, the second drive signal S2,S3, the current (I_L1) through the inductor L1 of the power conversion circuit 206, and the amplifier supply voltage Vampsupply. For the example waveforms 600 shown in FIG. 6, synchronous rectification is used in the drive logic block 238. The MOSFETs S1 and S4 turn ON for a period of time and the current in the inductor L1 increases. The MOSFETs S1 and S4 then turn OFF after the period of time, and the MOSFETs S2 and S3 turn ON in order to permit the inductor current in inductor L1 to flow to the Vampsupply node (e.g., in accordance with synchronous rectification principles) with very little voltage drop. The MOSFETs S2 and S3 then turn off when the inductor current falls to zero. The average Vampsupply voltage in this embodiment is regulated proportional to Vsupplytarget set by the system volume position and the offset, and is adequately high enough to supply voltage to the amplifier and avoid clipping collisions between the amplifier output signals Va, Vb, Vc, and Vd and the Vampsupply voltage.

Figure 7:
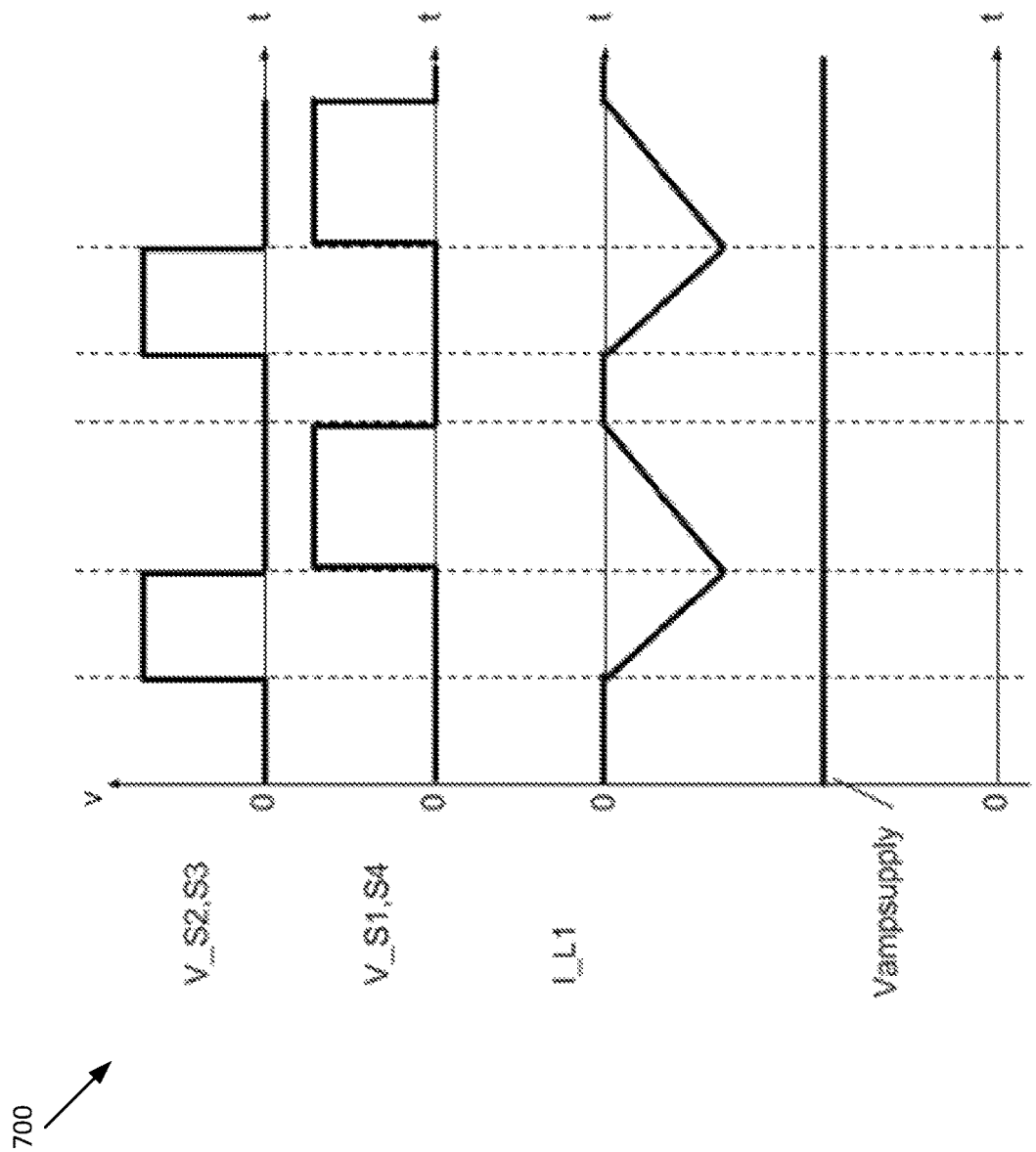
FIG. 7 illustrates example waveforms of various signals that may be used by the system of FIG. 2 in the charge mode, in accordance with various embodiments.

FIG. 7 illustrates example waveforms 700 for various signals of the system 200 of FIG. 2 during the charge mode. The waveforms 700 include the first drive signal V_S1,S4, the second drive signal S2,S3, the current (I_L1) through the inductor L1 of the power conversion circuit 206, and the amplifier supply voltage Vampsupply. For the example waveforms 700 shown in FIG. 7, synchronous rectification is used in the drive logic block 238. The MOSFETs S2 and S3 turn on for a period of time and the current in the inductor L1 goes negative with increasing magnitude. The MOSFETs S2 and S3 then turn OFF after the period of time, and the MOSFETs S1 and S4 turn ON in order to permit the current in the inductor L1 to flow to Vbattery (e.g., in accordance with synchronous rectification principles) with very little voltage drop, and thereby charge the battery. The MOSFETs S1 and S4 then turn off when the magnitude of the current in the inductor L1 falls to zero. The Vampsupply voltage in this embodiment is equal to the output voltage of the AC/DC adapter less a diode drop due to diode D1. The Vampsupply voltage is high enough to supply voltage to the amplifier and avoid clipping collisions between the amplifier output signals Va, Vb, Vc, and Vd and the Vampsupply voltage.

Figure 8:
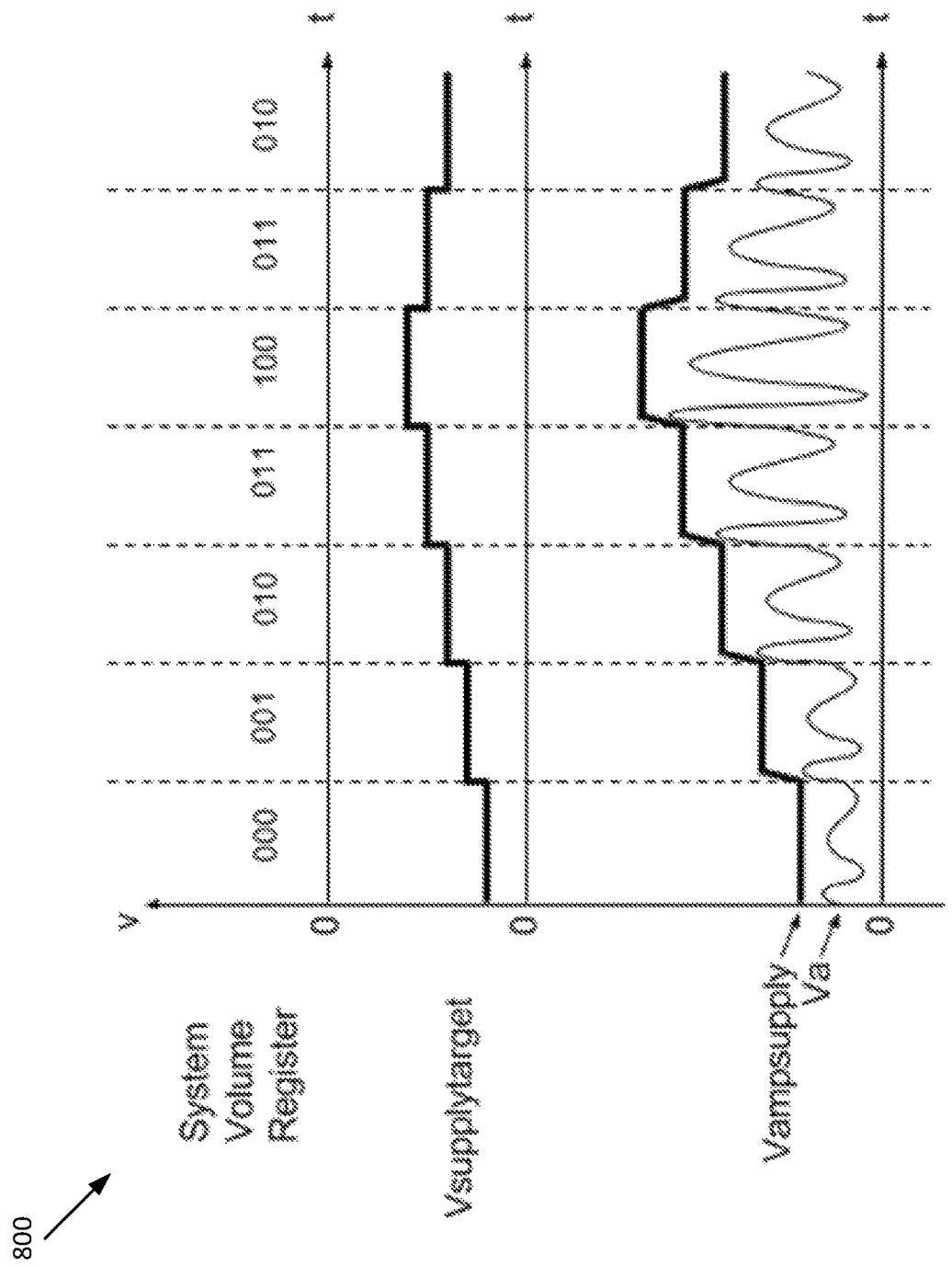
FIG. 8 illustrates example waveforms of the target supply voltage, the amplifier supply voltage, and the amplifier output voltage for various values of the system volume setting that may be used by the system of FIG. 2 in the discharge mode, in accordance with various embodiments.

FIG. 8 illustrates example waveforms 800 for various signals in the system 200 when the volume setting is adjusted (e.g., by the user), in accordance with some embodiments. The example waveforms 800 include the volume setting stored in the system volume register, the target supply voltage Vsupplytarget, the amplifier supply voltage Vampsupply, and the amplifier output voltage signal Va. In this embodiment, the volume setting stored in the system volume register is represented by a 3-bit digital value. It will be apparent that a different number of bits may be used for the volume setting in other embodiments. Additionally, or alternatively, in some embodiments, the volume setting stored in the system volume register may be down-sampled from the actual volume setting on the audio device. For example, the audio device may have more available volume settings (e.g., corresponding to more bits) than the available volume settings (e.g., corresponding to the number of bits) that may be stored in the system volume register.

Figure 9:
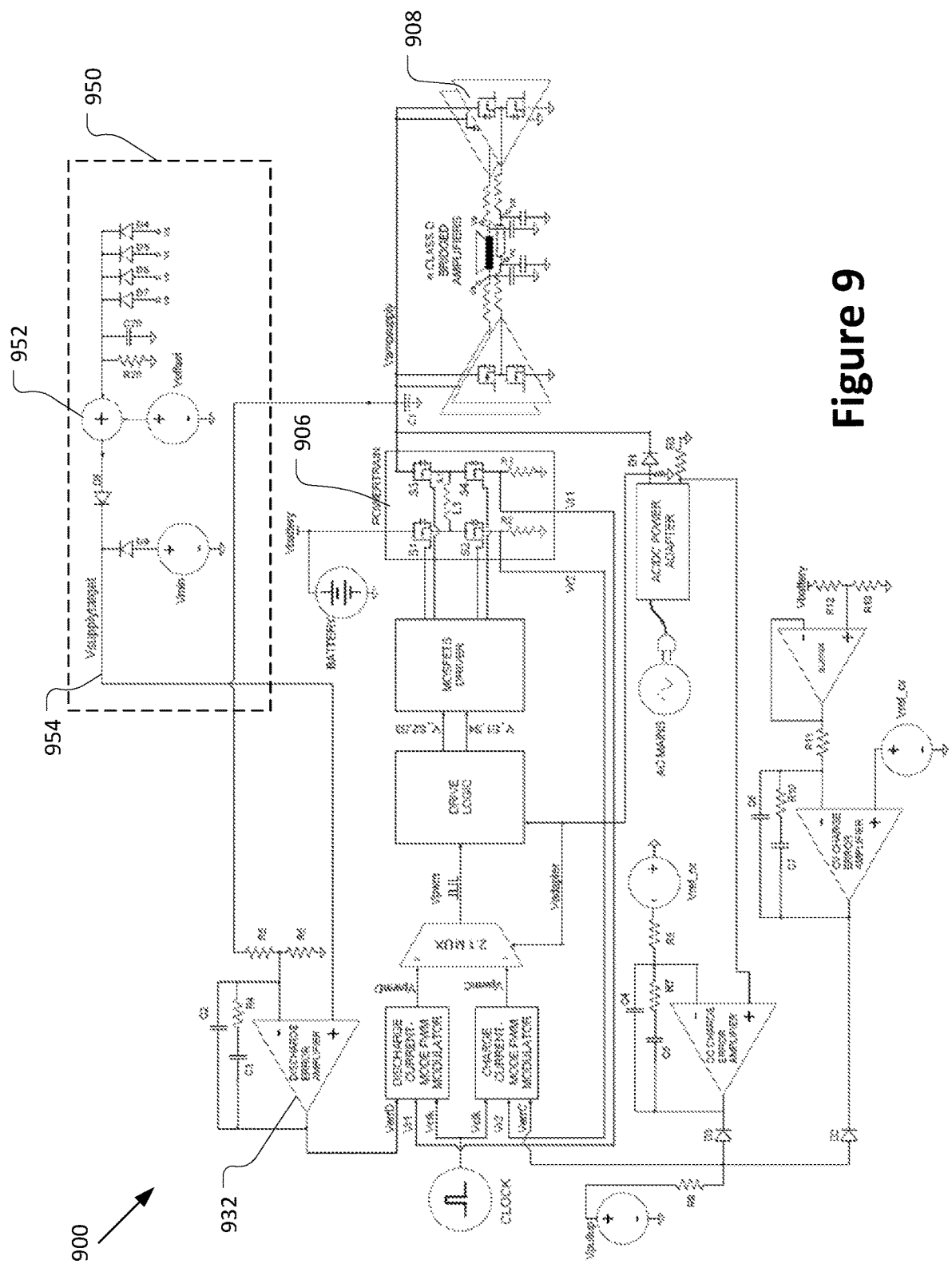
FIG. 9 illustrates another battery-powered audio system to provide a regulated amplifier supply voltage based on an audio signal processed by the amplifiers (e.g., based on the peak amplifier output voltage) during a discharge mode of the system, in accordance with various embodiments.

FIG. 9 illustrates another example of a portable battery-powered audio system 900 (hereinafter "system 900") in accordance with various embodiments. System 900 may be another example implementation of the system 100 described above with reference to FIG. 1. The system 900 may set the voltage level of the amplifier supply voltage Vampsupply during the discharge mode based on the audio signal that is processed by the amplifiers 908.

For example, the system 900 may generate a supply target voltage that corresponds to a peak value of the amplifier output voltage. In some embodiments, a peak-hold-with-decay scheme may be used to generate the supply target voltage based on the amplifier output voltage, e.g., so that the supply target voltage lowers more slowly after a peak in the amplifier output voltage. In some embodiments, the supply target voltage may correspond to the peak value of the amplifier output voltage plus an offset voltage. Additionally, or alternatively, the supply target voltage may be subject to a minimum voltage. That is, the system 900 may set the supply target voltage as the greater of the minimum voltage or the value that corresponds to the peak value of the amplifier output voltage (e.g., plus an offset voltage). In embodiments of the system 900 in which multiple amplifier channels share the amplifier supply voltage Vampsupply, the system 900 may determine the supply target voltage based on the amplifier output voltage having the peak of the greatest magnitude (e.g., at any given time using the peak-hold-with-decay scheme).

As an example implementation of this control scheme, the system 900 may include target supply circuitry 950 to generate the target supply voltage. The target supply circuitry 950 may receive the amplifier output voltages Va, Vb, Vc, and Vd from the respective amplifiers 908. An addition block 952 may receive the amplifier output voltages via respective diodes D4, D5, D6, and D7, thereby effectively passing the maximum value from among the amplifier output voltages to the addition block 952. After a peak in the maximum amplifier output voltage, the voltage level received by the addition block 952 may decay according to a time constant provided by capacitor C20 and resistor R20.

The addition block 952 may add an offset voltage Voffset to the maximum amplifier output voltage and the generated voltage may be coupled to a target voltage node 954 via a diode D8. A minimum voltage Vmin may also be coupled to the target voltage node 954 via another diode D9. Accordingly, the target voltage node 954 may receive the greater of the minimum voltage Vmin or the output voltage from the addition block 952 (which corresponds to the maximum amplifier output voltage plus the offset voltage Voffset). The resulting target supply voltage Vsupplytarget at the target voltage node 954 may be passed to the discharge error amplifier 932, which may be similar to the discharge error amplifier 232 of system 200. The discharge error amplifier 932 may generate an error signal VerrD based on the target supply voltage Vsupplytarget and the amplifier supply voltage Vampsupply, in order to provide the amplifier supply voltage with a regulated voltage level that is substantially proportional to the target supply voltage Vsupplytarget.

Accordingly, when in discharge mode, the target supply voltage Vsupplytarget generated by the target supply circuitry 950 may cause the amplifier supply voltage Vampsupply to follow an envelope of the largest-magnitude of the amplifier output voltages, wherein Vampsupply rises rapidly as needed during a large amplifier output voltage transient, then decays gradually (e.g., according to the time constant provided by capacitor C20 and resistor R20) until another large transient occurs.

The remaining components of the system 900 may be similar to corresponding components of the system 200 discussed above, and thus will not be described again here.

In another embodiment, the target supply voltage may be determined based on a forward-looking version of the audio signal. For example, the peak-hold-with-decay function and the comparison with the minimum voltage may be performed in the digital domain, e.g., using digital delay memory to effectively create time-advanced audio signals to permit the power conversion circuitry to slew the amplifier supply voltage Vampsupply at capacitor C1 to a higher target value prior to the amplifier reproducing the corresponding audio signal levels (e.g., on the order of a few milliseconds or tenths of milliseconds prior).

In some embodiments, the target supply voltage Vtargetsupply may be digitized such that the amplifier supply voltage Vampsupply is regulated to one of a number of discrete voltage levels (e.g., proportional to the envelope of the audio signals being reproduced). Additionally, or alternatively, while the system 900 is described with reference to determining the target supply voltage Vtargetsupply based on the amplifier output voltages, other embodiments may determine the target supply voltage Vtargetsupply based on one or more other or additional operating parameters, such as the amplifier analog input voltages (associated with the audio signals), a combination of the amplifier input and output voltages, and/or the difference between the amplifier output voltage and the amplifier supply voltage Vampsupply.

Figure 10:
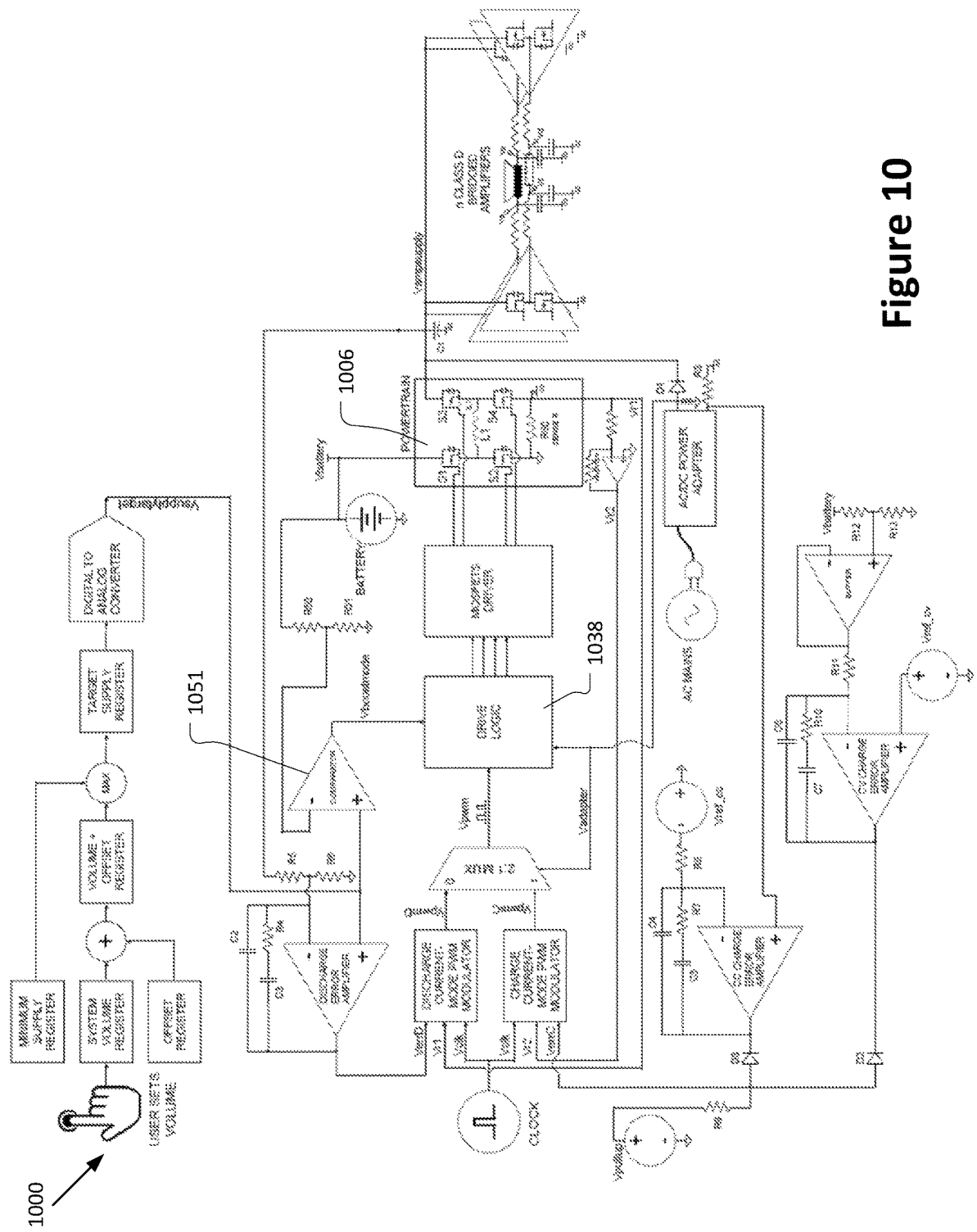
FIG. 10 illustrates another battery-powered audio system that may selectively operate the power conversion circuit as a buck converter or a boost converter during the discharge mode, or as a buck converter during the charge mode, in accordance with various embodiments.

FIG. 10 illustrates an example of a battery-powered audio system 1000 (hereinafter "system 1000") that, in discharge mode, may selectively operate the power conversion circuit 1006 as a buck converter (e.g., when the target supply voltage is lower than the battery voltage Vbattery) or a boost converter (e.g., when the target supply voltage is higher than the battery voltage Vbattery), or, in charge mode, as a buck converter transferring power from the AC/DC Power Adapter to the battery, as described above.

For example, the System 1000 may be another example implementation of the system 100 described above with reference to FIG. 1. The system 1000 may be similar to the system 100 and/or 900 depicted in FIGS. 1 and 9, respectively, except that the system 1000 includes a mode selection circuit 1051 to determine whether the target supply voltage is greater or less than the battery voltage and to control the power conversion circuit 1006 (e.g., via the drive logic 1038) to operate in the buck mode or the boost mode based on the determination.

For example, the mode selection circuit 1051 may include a comparator, as shown in FIG. 10, to compare the target supply voltage to the battery voltage (e.g., a voltage divided version of the battery voltage provided by resistors R50 and R51). The output of the comparator may be passed to the drive logic 1038. If the target supply voltage is lower than the battery voltage Vbattery, the mode selection circuit 1051 may control the MOSFET S3 of the power conversion circuit 1006 to remain ON (e.g., for a complete clock cycle) and the MOSFET S4 to remain OFF. The MOSFET S1 ON time pulse width may be modulated (e.g., by the discharge current-mode PWM modulator) and the MOSFET S2 may be used as a synchronous rectifier. Accordingly, the power conversion circuit 1006 may behave as a buck converter.

However, if the target supply voltage is higher than the battery voltage Vbattery, the mode selection circuit 1051 may control the MOSFET S1 to remain ON and the MOSFET S2 to remain OFF. The MOSFET S4 ON time pulse width may be modulated (e.g., by the discharge current-mode PWM modulator) and the MOSFET S3 may be used as a synchronous rectifier. Accordingly, the power conversion circuit 1006 may behave as a boost converter.

Additionally, or alternatively, in some embodiments, during the charge mode, the control circuitry may control the power conversion circuit 1006 to operate as a buck converter (e.g., in the reverse direction from the discharge mode, referred to as a charge buck mode). That is, transistor S3 may be modulated as PWM buck converter, S4 modulated as synchronous rectifier, S1 ON (e.g. for a complete clock cycle), and S2 OFF (e.g. for a complete clock cycle). The buck converter functionality of the power conversion circuit 1006 is not specific to the embodiment of FIG. 10, and may also be used by the power conversion circuits described elsewhere herein in some embodiments (e.g., in the embodiments of FIGS. 1, 2, and/or 9).

Figure 11:
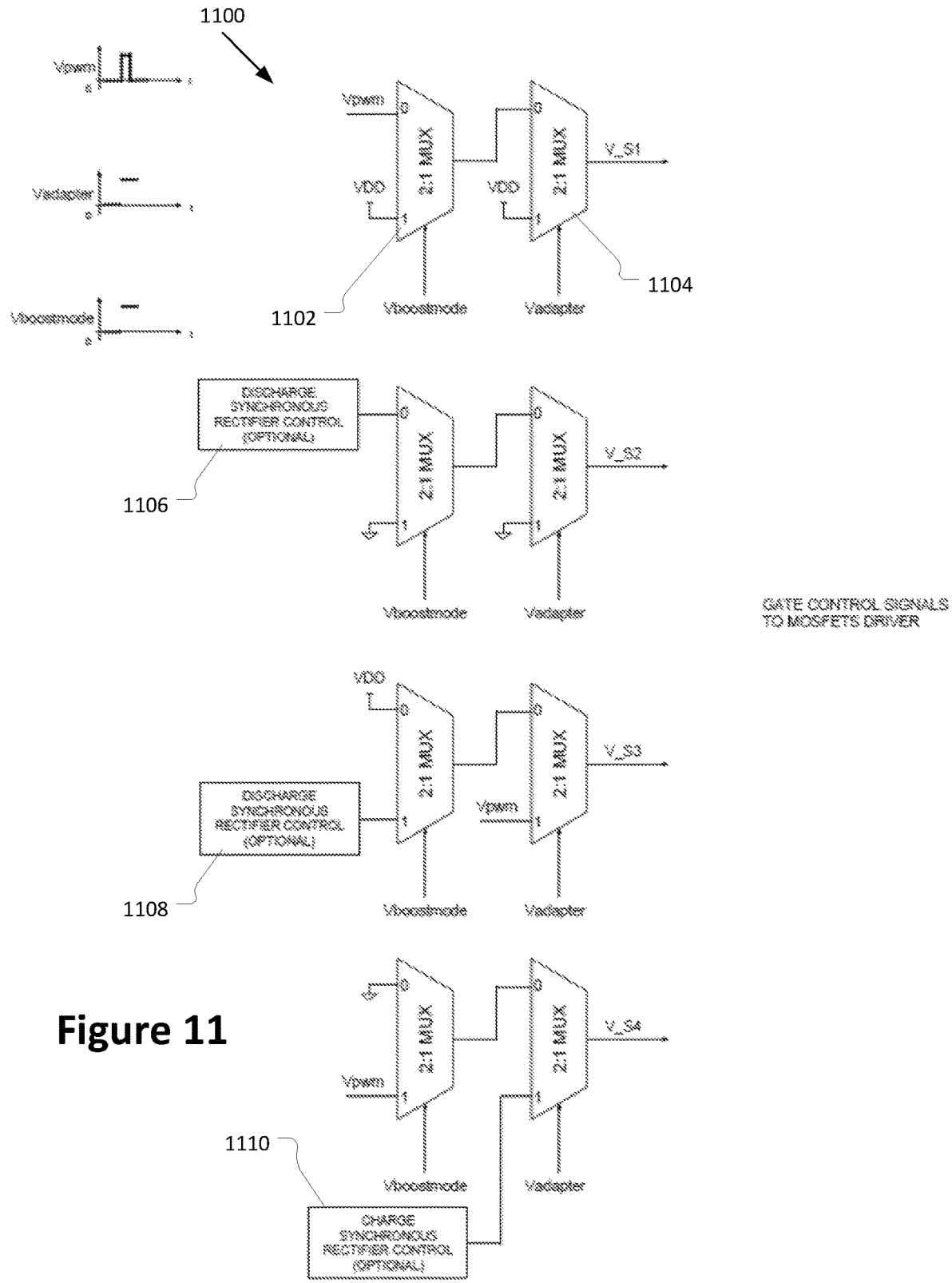
FIG. 11 illustrates switching control circuitry that may be included in the drive logic of the system of FIG. 10 to control the transistors of a power conversion circuit to selectively operate in a boost mode or buck mode, in accordance with various embodiments.

FIG. 11 shows switching control circuitry 1100 that may be used to control the transistors (e.g., S1, S2, S3, and S4) of a power conversion circuit (e.g. power conversion circuit 1006 or another power conversion circuit described herein) to selectively operate in a boost mode or buck mode as described above with respect to FIG. 10. For example, the switching control circuitry 1100 may be included in drive logic 1038 in some embodiments. As shown, the switching control circuitry 1100 may include a pair of multiplexers 1102 and 1104 to provide the switching control signals to the respective gate terminals of the switching transistors. The switching control circuitry 1100 may include discharge synchronous rectifier control circuitry 1106 and 1108 to selectively operate respective transistor S2 or transistor S3 as synchronous rectifiers during the discharge mode, as described herein. The switching control circuitry 1100 may further include a charge synchronous rectifier control circuitry 1110 to selectively operate the transistor S4 as a synchronous rectifier during the charge mode, as described herein.

Figure 12:
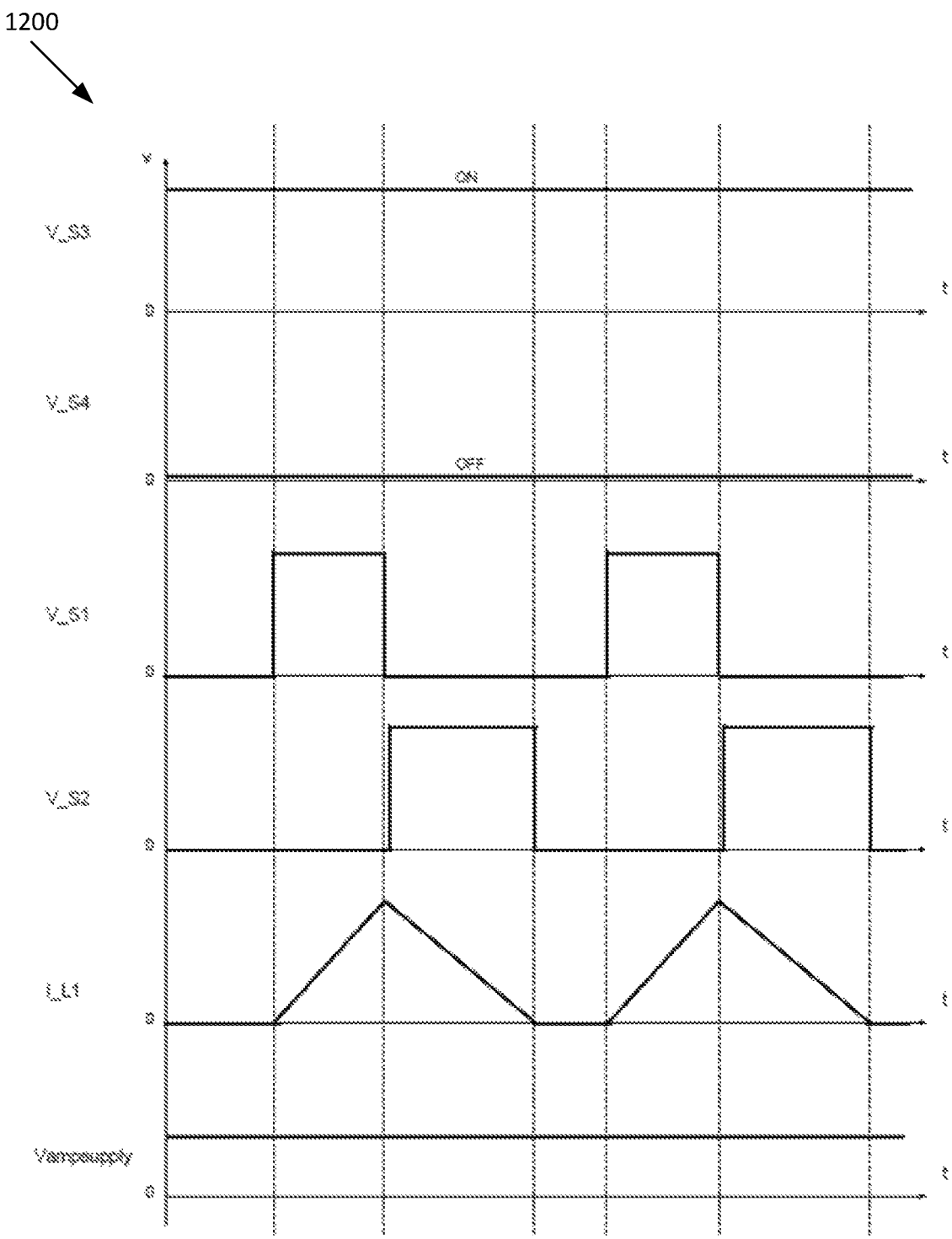
FIG. 12 illustrates example waveforms for various signals of the systems described herein to operate the power conversion circuit in the buck mode during the discharge mode, in accordance with various embodiments.

FIG. 12 illustrates example waveforms 1200 for various signals of the system 1000 to operate the power conversion circuit 1006 in the buck mode during the discharge mode (e.g., when the target supply voltage is less than the battery voltage), in accordance with various embodiments. The waveforms 1200 may be an alternative to waveforms 600 of FIG. 6. The waveforms 1200 include the drive signals V_S1, V_S2, V_S3, and V_S4 to control respective transistors S1, S2, S3, and S4 of the power conversion circuit 1006, the current (I_L1) through the inductor L1 of the power conversion circuit 1006, and the amplifier supply voltage Vampsupply.

Figure 13:
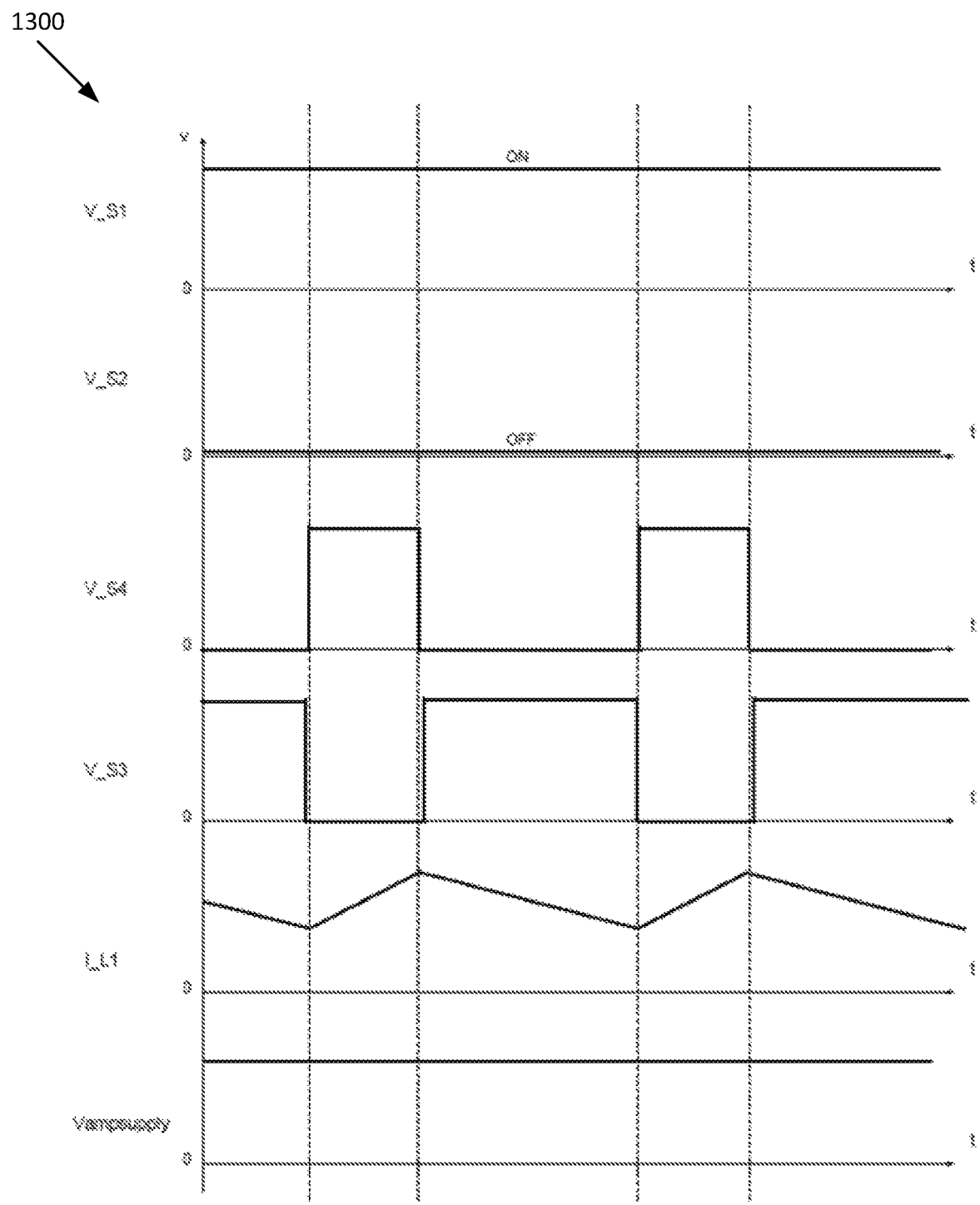
FIG. 13 illustrates example waveforms for various signals of the systems described herein to operate the power conversion circuit in the boost mode during the discharge mode, in accordance with various embodiments.

FIG. 13 illustrates example waveforms 1300 for various signals of the system 1000 to operate the power conversion circuit 1006 in the boost mode during the discharge mode (e.g., when the target supply voltage is greater than the battery voltage), in accordance with various embodiments. The waveforms 1300 may be an alternative to waveforms 600 of FIG. 6. The waveforms 1300 include the drive signals V_S1, V_S2, V_S3, and V_S4 to control respective transistors S1, S2, S3, and S4 of the power conversion circuit 1006, the current (I_L1) through the inductor L1 of the power conversion circuit 1006, and the amplifier supply voltage Vampsupply.

Figure 14:
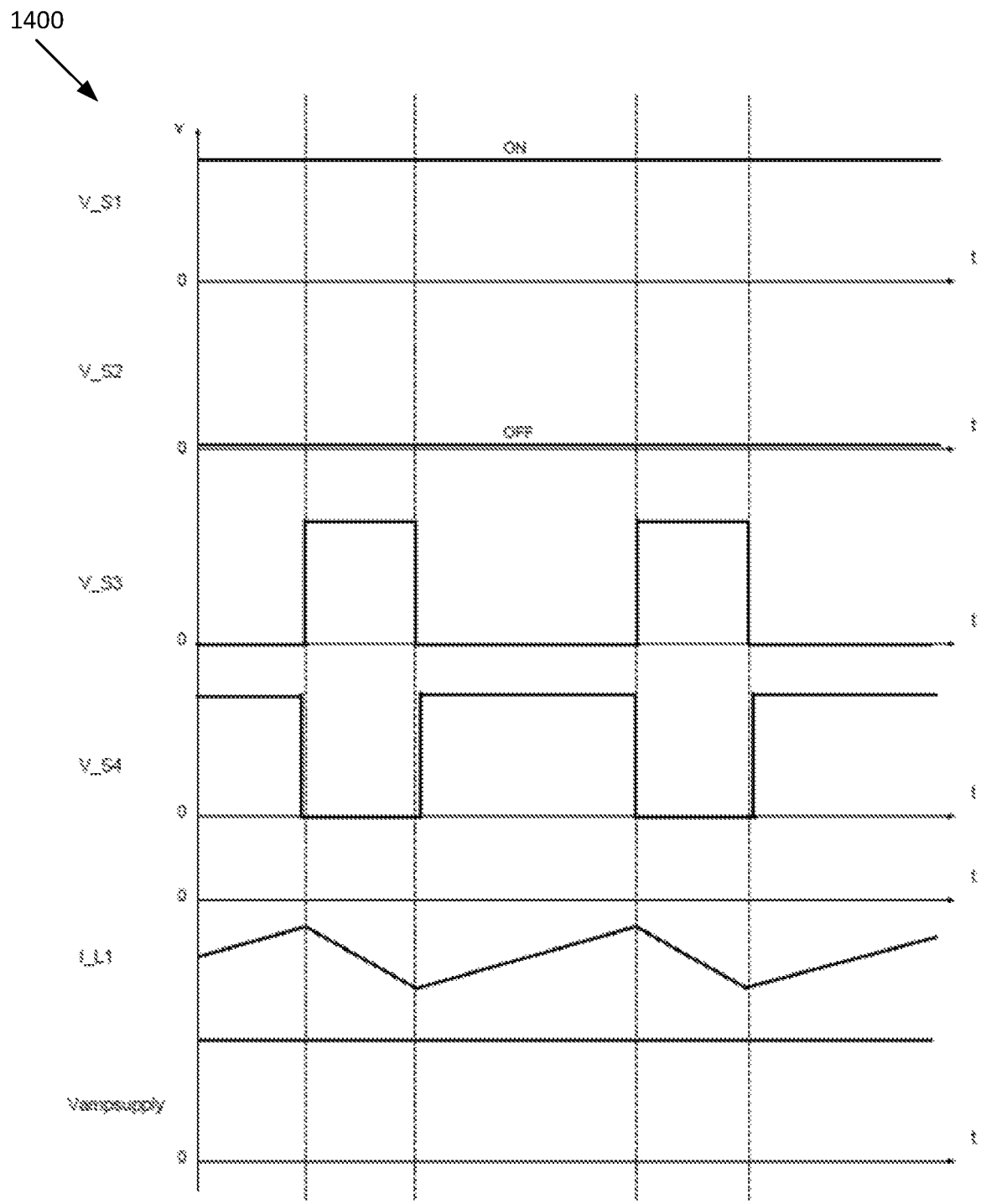
FIG. 14 illustrates example waveforms for various signals of the systems described herein to operate the power conversion circuit in the buck mode during the charge mode, in accordance with various embodiments.

FIG. 14 illustrates example waveforms 1400 for various signals of the system 1000 to operate the power conversion circuit 1006 in the buck mode during the charge mode, in accordance with various embodiments. The waveforms 1400 may be an alternative to waveforms 700 of FIG. 7. The waveforms 1400 include the drive signals V_S1, V_S2, V_S3, and V_S4 to control respective transistors S1, S2, S3, and S4 of the power conversion circuit 1006, the current (I_L1) through the inductor L1 of the power conversion circuit 1006, and the amplifier supply voltage Vampsupply.

In various embodiments, the systems described herein may be used with any suitable type of audio amplifiers, such as switching types (Class D) or linear types (Class A or Class AB or Class B), or a combination thereof. Regardless of the type of amplifiers used, the amplifier power dissipation and thereby the system power dissipation may be reduced by reducing the amplifier supply voltage Vampsupply used to supply the amplifier when permissible, as described herein. This reduction of system power dissipation increases battery run time for the portable audio device.

The circuits, systems, and methods disclosed herein may be used in any suitable battery-powered audio devices, such as portable battery-powered audio devices, including, but not limited to wireless audio speakers (e.g., using any suitable wireless interface, such as Bluetooth, local area network (LAN, e.g., WiFi), cellular (such as Third Generation Partnership Protocol (3GPP) cellular, and/or another suitable wireless network interface), smart-home speakers, smartphones, laptop computers, and/or other suitable devices. The battery-powered audio device may further include a wireless network interface (e.g., using any suitable wireless interface, such as Bluetooth, local area network (LAN, e.g., WiFi), cellular (such as Third Generation Partnership Protocol (3GPP) cellular, and/or another suitable wireless network interface) to receive audio signals to be reproduced by the speaker of the device. An audio processor circuit may be coupled between the wireless network interface and the amplifiers of the device, to process the audio signals received by the wireless network interface into a form that is usable by the amplifiers. For example, the audio processor may include a digital signal processor to implement audio processing such as filtering and delays, and a digital-to-analog converter to convert a digital audio signal to an analog audio signal that is processed by the amplifiers. Additionally, or alternatively, the battery-powered audio device may include one or more additional components, such as one or more processors, memory (e.g., random access memory (RAM), mass storage (e.g., flash memory, hard-disk drive (HDD), etc.), antennas, etc.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

What is claimed is:

1. A circuit for an audio reproduction system, the circuit comprising:
    a single power conversion circuit to be directly coupled to a battery and one or more audio amplifiers, wherein the power conversion circuit is further coupled to an alternating current-to-direct current (AC/DC) adapter;
    a control circuit coupled to the power conversion circuit, the control circuit to:
        when the AC/DC adapter is coupled between the power conversion circuit and an external alternating current (AC) mains, operate in a charge mode to control the power conversion circuit to charge the battery from the AC/DC adapter; and
        when the AC/DC adapter is not coupled between the power conversion circuit and the external AC mains, operate in a discharge mode to control the power conversion circuit to generate an amplifier supply voltage from the battery to be provided to the one or more audio amplifiers.

2. The circuit of claim 1, wherein, in charge mode, the control circuit is to regulate a first current drawn by the power conversion circuit from the AC/DC adapter to charge the battery based on a second current that is drawn by the one or more amplifiers from the AC/DC adapter so that a total of the first and second currents is less than a threshold.

3. The circuit of claim 2, wherein, in charge mode, to regulate the first current and to regulate a battery voltage of the battery, the control circuit includes:
    a constant current (CC) charge error amplifier to compare an output current magnitude of the power supply with a target current magnitude and output a CC output signal based on the comparison;
    a constant voltage (CV) charge error amplifier to compare the battery voltage to a CV reference voltage and output a CV output signal based on the comparison; and
    a charge pulse width modulation (PWM) modulator to receive a lesser of the CC output signal or the CV output signal as a charge error signal and to control modulation of the power conversion circuit based on the charge error signal.

4. The circuit of claim 1, wherein, in the discharge mode, the control circuit is to regulate a voltage level of the amplifier supply voltage based on one or more operating conditions of the audio system.

5. The circuit of claim 4, wherein, to regulate a voltage level of the amplifier supply voltage, the control circuit includes:
    target circuitry to generate a target supply voltage based on the one or more operating conditions;
    a discharge error amplifier to generate a discharge error signal based on the amplifier supply voltage and the target supply voltage; and
    a discharge pulse width modulation (PWM) modulator to generate a discharge-mode variable PWM signal based on the discharge error signal, the discharge-mode variable PWM signal to control the power conversion circuit to generate the amplifier supply voltage.

6. The circuit of claim 4, wherein the one or more operating conditions include a system volume setting, a magnitude of an input audio signal at an input of the one or more amplifiers, a magnitude of an output audio signal at an output of the one or more amplifiers, or a time-advance envelope of an upcoming audio signal.

7. The circuit of claim 4, wherein the control circuit is to regulate the voltage level within a range of possible values that includes a voltage level less than a battery voltage of the battery and a voltage level greater than the battery voltage.

8. The circuit of claim 1, wherein the power conversion circuit is a switching power control circuit having a plurality of switching transistors and a single inductor.

9. The circuit of claim 1, wherein the control circuit is to control the power conversion circuit to:
operate in a buck mode during the discharge mode when a target supply voltage of the amplifier supply voltage is less than a battery voltage of the battery; and
operate in a boost mode during the charge mode when the target supply voltage is greater than the battery voltage.

10. The circuit of claim 9, wherein the control circuit is to control the power conversion circuit to operate in a charge buck mode during the charge mode.

11. An audio reproduction system comprising:
one or more audio amplifiers;
a single power conversion circuit to be directly coupled to a battery and one or more audio amplifiers, wherein the power conversion circuit is further coupled to an alternating current-to-direct current (AC/DC) adapter;
a control circuit coupled to the power conversion circuit, the control circuit to:
during a charge mode, control the power conversion circuit to charge the battery from the AC/DC adapter; and
during a discharge mode, control the power conversion circuit to generate an amplifier supply voltage from the battery to be provided to the one or more audio amplifiers.

12. The system of claim 11, wherein, during the charge mode, the control circuit is to regulate a first current drawn from the AC/DC adapter to charge the battery based on a second current that is drawn by the one or more amplifiers from the AC/DC adapter so that a total of the first and second currents is less than a threshold.

13. The system of claim 12, wherein, to regulate the first current and to regulate a battery voltage of the battery, the control circuit includes:
a constant current (CC) charge error amplifier to compare an output current magnitude of the power supply with a target current magnitude and output a CC output signal based on the comparison;
a constant voltage (CV) charge error amplifier to compare the battery voltage to a CV reference voltage and output a CV output signal based on the comparison; and
a charge pulse width modulation (PWM) modulator to receive a lesser of the CC output signal or the CV output signal as a charge error signal and to control the power conversion circuit based on the charge error signal.

14. The system of claim 11, wherein the control circuit is to regulate a voltage level of the amplifier supply voltage based on one or more operating conditions of the audio system, wherein the control circuit is to regulate the voltage level within a range of possible values that includes a voltage level less than a battery voltage of the battery and a voltage level greater than the battery voltage.

15. The system of claim 14, wherein, to regulate the voltage level of the amplifier supply voltage, the control circuit includes:
target circuitry to generate a target supply voltage based on the one or more operating conditions;
a discharge error amplifier to generate a discharge error signal based on the amplifier supply voltage and the target supply voltage; and
a discharge pulse width modulation (PWM) modulator to generate a discharge-mode variable PWM signal based on the discharge error signal, the discharge-mode variable PWM signal to control the power conversion circuit to generate the amplifier supply voltage.

16. The system of claim 11, further comprising the AC/DC adapter and the battery.

17. A control circuit for a battery-powered audio system, the control circuit comprising:
charge-mode circuitry to, during a charge mode, control a single power conversion circuit that is directly coupled to a battery of the audio system to charge the battery from an alternating current-to-direct current (AC/DC) adapter; and
discharge-mode circuitry to, during a discharge mode, control the power conversion circuit to generate an amplifier supply voltage from the battery to be provided to one or more audio amplifiers that are directly coupled to the power conversion circuit, wherein the discharge-mode circuitry is to regulate a voltage level of the amplifier supply voltage based on one or more operating conditions of the audio system, wherein the discharge-mode circuitry is to regulate the voltage level within a range of possible values that includes a voltage level less than a battery voltage of the battery and a voltage level greater than the battery voltage.

18. The control circuit of claim 17, wherein, during the charge mode, the charge-mode circuitry is to regulate a first current drawn by the power conversion circuit from the AC/DC adapter to charge the battery based on a second current that is drawn by the one or more amplifiers from the AC/DC adapter so that a total of the first and second currents is less than a threshold.

19. The control circuit of claim 18, wherein, to regulate the first current and to regulate a battery voltage of the battery, the charge-mode circuitry includes:
a constant current (CC) charge error amplifier to compare an output current magnitude of the power supply with a target current magnitude and output a CC output signal based on the comparison;
a constant voltage (CV) charge error amplifier to compare the battery voltage to a CV reference voltage and output a CV output signal based on the comparison; and
a charge pulse width modulation (PWM) modulator to receive a lesser of the CC output signal or the CV output signal as a charge error signal and to control the power conversion circuit based on the charge error signal.

20. The control circuit of claim 17, wherein, to regulate the voltage level of the amplifier supply voltage, the discharge-mode circuitry includes:
target circuitry to generate a target supply voltage based on the one or more operating conditions;
a discharge error amplifier to generate a discharge error signal based on the amplifier supply voltage and the target supply voltage; and
a discharge pulse width modulation (PWM) modulator to generate a discharge-mode variable PWM signal based on the discharge error signal, the discharge-mode variable PWM signal to control the power conversion circuit to generate the amplifier supply voltage.

* * * * *